United States Patent [19]

Ramesh

[11] Patent Number: 5,270,298

[45] Date of Patent: Dec. 14, 1993

[54] CUBIC METAL OXIDE THIN FILM EPITAXIALLY GROWN ON SILICON

[75] Inventor: Ramamoorthy Ramesh, Tinton Falls, N.J.

[73] Assignee: Bell Communications Research, Inc., Livingston, N.J.

[21] Appl. No.: 925,350

[22] Filed: Aug. 4, 1992

Related U.S. Application Data

[63] Continuation-in-part of Ser. No. 846,358, Mar. 5, 1992, Pat. No. 5,155,658.

[51] Int. Cl.$^5$ .................. H01B 12/00; B32B 1/00; H01G 4/06
[52] U.S. Cl. ................................ 505/1; 361/313; 361/321.1
[58] Field of Search .............. 361/321, 313; 505/1; 357/51; 29/25.42

[56] References Cited

U.S. PATENT DOCUMENTS

| | | | |
|---|---|---|---|
| 4,677,336 | 6/1987 | Kushida et al. | 310/334 |
| 4,980,339 | 12/1990 | Setsune et al. | 505/1 |
| 5,051,950 | 9/1991 | Evans, Jr. et al. | 365/109 |
| 5,055,445 | 10/1991 | Belt et al. | 505/1 |
| 5,077,270 | 12/1991 | Takeda et al. | 505/1 |
| 5,130,294 | 7/1992 | Char | 505/1 |
| 5,142,437 | 8/1992 | Kammerdiner et al. | 361/313 |

OTHER PUBLICATIONS

D. K. Fork et al., "High critical currents in strained epitaxial $YBA_2Cu_3O_{7-\delta}$ on Si," *Applied Physics Letters*, 1990, vol. 57, pp. 1161–1163.
J. T. Cheung et al., "Conductive and epitaxial LaSrCoO thin film grown by pulsed laser deposition as electrodes for ferroelectric PLZT devices," *Abstracts: 4th International Symposium on Integrated Ferroelectrics*, Mar. 1992, Monterey, Calif., p. 9C.
E. C. Subbarao, "Ferroelectricity in $Bi_4Ti_3O_{12}$ and Its Solid Solutions," *Physical Review*, 1961, vol. 122, pp. 804–807.
D. R. Lampe et al., "Integration of UHV-grown ferroelectric films into nonvolatile memories," *Seventh International Symposium on the Applications of Ferroelectrics*, 1990, Paper 7.5.
K. Sreenivas et al., "Surfacce acoustic wave propagation on lead zirconate titanate thin films," *Applied Physics Letters*, 1988, vol. 52, pp. 709–711.
T. Kawaguchi et al., "PLZT thin-film waveguides," *Applied Optics*, 1984, vol. 23, pp. 2187–2191.
A. Mukherjee et al., "Electro–optic effects in thin–film lanthanum–doped lead zirconate titanate," *Optics Letters*, 1990, vol. 15, pp. 151–153.
S. H. Lee et al., "Two–dimensional silicon/PLZT spatial light modulators; design considerations and technology," *Optical Engineering*, 1986, vol. 25, pp. 250–260.
S. Thakoor, "High speed, nondestructive readout from thin–film ferroelectric memory," *Applied Physics Letters*, 1992, vol. 60, pp. 3319–3321.
R. Takayama et al., "Preparation and characteristics of pyroelectric infrared sensors made of c-axis oriented La-modified $PbTiO_3$ thin films," *Journal of Applied Physics*, 1987, vol. 61, pp. 411–415.
R. E. Newnham et al., "Smart Electroceramics," *Journal of the American Ceramics Society*, 1991, vol. 74, pp. 463–479.
S. L. Swartz, "Topics in Electronic Ceramics," *IEEE Transactions on Electrical Insulation*, 1990, vol. 25, pp. 935–987.

*Primary Examiner*—Donald A. Griffin
*Attorney, Agent, or Firm*—Leonard Charles Suchyta; James W. Falk

[57] ABSTRACT

A method of forming crystalline metal oxide thin films on silicon and the resultant structure. A crystalline buffer layer (10) of yttria-stabilized zirconia is deposited on a silicon substrate (12). A thin template layer (10) of an anisotropic perovskite such as bismuth titanate or yttria barium copper oxide is deposited on the template layer under conditions favoring c-axis oriented growth. A nominally cubic metal-oxide layer (16) is deposited on the template layer which facilitates its singly crystalline growth. The metal oxide, often a nominally cubic perovskite, may be a conductive electrode, a ferroelectric, a non-hysteretic dielectric, a piezoelectric, or other class of material.

17 Claims, 2 Drawing Sheets

CUBIC METAL OXIDE THIN FILM EPITAXIALLY GROWN ON SILICON

RELATED APPLICATION

This application is a continuation-in-part of Ser. No. 07/846,358, filed Mar. 5, 1992, now issued on Oct. 13, 1992, as U.S. Pat. No. 5,155,658.

FIELD OF THE INVENTION

In general, the invention relates to crystalline thin films and their growth. In particular, it relates to the growth of cubic perovskite or metal oxide thin films on a silicon substrate with intermediate buffer layers.

BACKGROUND ART

Epitaxial thin films, once the nearly exclusive preserve of semiconductor technology, have been recently used to advantage in several other technologies.

High-temperature superconductors, such as $YBa_2Cu_3O_{7-x}$ (YBCO), exhibit the best and most reproducible superconductive behavior when they are epitaxially grown as singly crystalline thin films on a crystalline substrate. Most of these high-temperature ceramic superconductors have an anisotropic perovskite crystalline structure. For instance, YBCO has a- and b-axis lattice parameters of 0.382 and 0.388 nm but a c-axis lattice parameter of 1.168 nm. Inam et al. have disclosed in U.S. patent application Ser. No. 07/531,255, filed May 31, 1991, a superconducting Josephson device in which two YBCO electrodes sandwich an insulating or at most semiconducting or normally conducting layer of $PrBa_2Cu_3O_{7-x}$. All three layers are epitaxially grown with a c-axis orientation; that is, the c-axis is perpendicular to the plane of the film.

I and my co-inventors have extended this approach to ferroelectric materials for use in memories. In U.S. Pat. Nos. 5,155,658 and 5,168,420 both incorporated herein by reference and commonly assigned with the present invention, I and my co-inventors describe a device in which two YBCO electrodes sandwich a ferroelectric layer of, for example, $PbZr_xTi_{1-x}O_3$, where $0 < x < 1$ (PZT), which is only slightly distorted from a cubic lattice structure. All the three layers are epitaxially grown so as to be singly crystalline thin films. In one embodiment, the YBCO is c-axis oriented, that is, the c-axis is perpendicular to the film surface and the bottom YBCO layer is grown directly on a $LaAlO_3$ substrate. It is not anticipated that such ferroelectric memories would operate at superconducting temperatures; instead, they rely on the normal conductivity of the YBCO electrodes.

Both superconductive devices and ferroelectric devices would enjoy greater commercial success if they could be integrated on a silicon substrate with silicon electronic circuitry. As a result, the technology has developed for epitaxially growing YBCO on Si. Fork et al. have disclosed such a technique in "High critical currents in strained epitaxial $YBa_2Cu_3O_{7-\delta}$ on Si," *Applied Physics Letters*, volume 57, 1990, pp. 1161-1163. They first deposit a layer of yttria-stabilized zirconia $((Y_2O_3)_x(Zr_2O_3)_{1-x}$, hereinafter YSZ) on a silicon substrate and then deposit the YBCO on the YSZ.

Although I suggested the structure Si/YSZ/YBCO/PZT/YBCO in my parent U.S. Patent Application, it is not completely satisfactory for many important applications. The electrodes should be structurally and electrically symmetric, and the upper YBCO electrode needs to be grown at a temperature too high for the underlying, already deposited PZT. Furthermore, several recently discovered high-temperature ceramic superconductors, such as $BaKBiO_3$ do not have an anisotropic perovskite crystal structure, but instead have a cubic or nearly cubic crystal lattice structure. Also, electrodes for ferroelectric memories do not even need to be superconductive at any temperature but only need to show a reasonable conductivity. Recent work on singly crystalline ferroelectric memories have included conductive oxide electrodes composed of lanthanum strontium cobalate $(La_{1-x}Sr_xCoO_3$, where $0 < x < 1$, hereinafter LSCO), grown on $SrTiO_3$. Cheung et al. discloses this structure in "Conductive and epitaxial LaSrCoO thin film grown by pulsed laser deposition as electrodes for ferroelectric PLZT devices," *Abstracts: 4th International Symposium on Integrated Ferroelectrics*, Monterey, Calif., March 1992 at p. 9 C. This material, which can be grown at a much lower temperature, is nominally cubic with crystal lattice parameters of $0.382 \pm 0.01$ nm. By nominally cubic is meant that the lattice parameters do not differ by more than 5% and the crystal lattice axes are perpendicular to within 3°. Furthermore, a need exists to directly form monocrystalline layers of ferroelectric materials such as PZT or dielectric materials such as strontium titanate ($SrTiO_3$) on Si substrates. My experience is that nominally cubic perovskites cannot be epitaxially grown with high quality on YSZ-buffered Si substrates.

SUMMARY OF THE INVENTION

The invention can be summarized as the method of fabricating crystalline metal-oxide thin films on a silicon substrate and the resultant devices. A buffer layer of, for example, yttria-stabilized zirconia is grown on the silicon, and a template of a c-axis oriented anisotropic perovskite is grown on the buffer layers. The template causes an after-grown cubic metal oxide to have highly oriented crystallinity. The cubic metal oxide can be used as one of several different parts of a layered crystalline device, for example, an electrode or a ferroelectric.

DETAILED DESCRIPTION OF THE PREFERRED EMBODIMENTS

I believe that the anisotropic perovskites, alternatively referred to as the layered perovskites, exhibit a great propensity to grow with a c-axis orientation under the correct growth conditions. The patent application to Inam et al. defines perovskite materials. This propensity, apparently arising from the lower free energy of an exposed a-b crystalline plane during growth, is sufficient to overcome a lattice mismatch of 5.6% in the a-b plane between YBCO and YSZ and to cause the YBCO to grow on the YSZ with a c-axis orientation. In my parent U.S. Patent Application, we describe how a c-axis oriented YBCO layer can be grown on a YSZ buffer layer deposited on silicon. The YBCO acts not only as an electrode but also as a template for the later grown ferroelectric which exhibits greater than 80% c-axis orientation. On the other hand, the nominally cubic perovskites do not exhibit such a strong propensity for crystalline growth of any particular orientation. As a result, nominally cubic perovskites tend to grow on YSZ as polycrystalline films or as the incorrect phase under growth conditions that would provide high-quality singly crystalline perovskite films on LaAlO$_3$.

Figure 1:
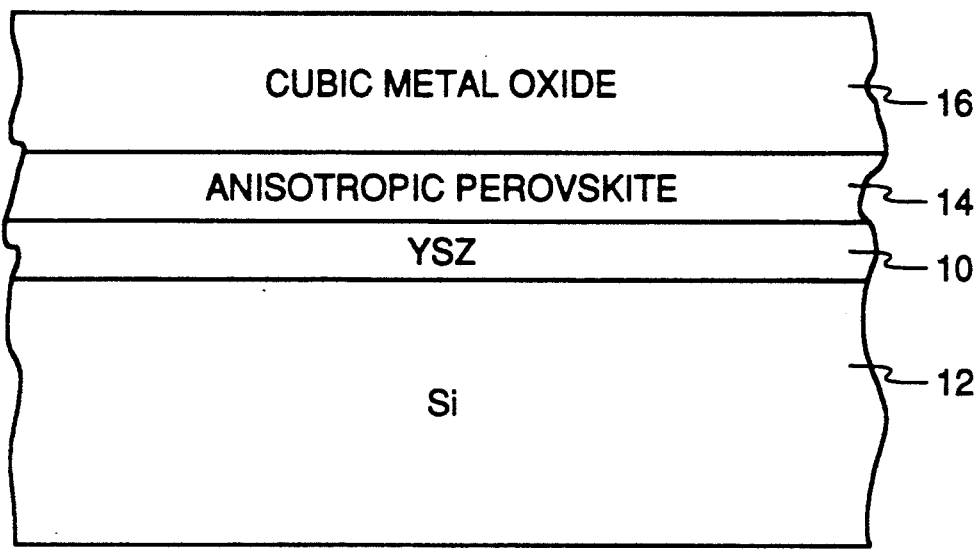
FIG. 1 is a cross-sectional view of a basic embodiment of the invention.

I have discovered that a layered or anisotropic perovskite provides a template for the epitaxial growth of a cubic perovskite on YSZ-buffered silicon. As illustrated in FIG. 1, a layer 10 of yttria-stabilized zirconia (YSZ) is grown on a singly crystalline silicon substrate 12. The YSZ is fully stabilized if it contains between 8 and 18 mole % yttria, preferably around 9 mole %. Fully-stabilized YSZ forms with a (100) orientation on (100)-oriented silicon. A layer 14 of an anisotropic perovskite is deposited on the YSZ layer under growth conditions favorable to the formation of substantially singly crystalline, c-axis oriented films. By an anisotropic or layered perovskite is meant a perovskite material that is not nominally cubic. Many technologically important anisotropic perovskites have a c-axis lattice parameter that is longer than the a- and b-axes lattice parameters by a factor of two or more, but the lattice cell is approximately rectangular. The anisotropic perovskite layer 14 acts as a template layer for the epitaxial growth of a layer 16 of a nominally cubic metal oxide, which is typically a perovskite material. Such a template layer 14 facilitates the epitaxial growth of the overlayer having a well defined crystalline orientation, that is, substantially singly crystalline. Examples of the metal oxide, that is, having both a metal ion and an oxygen, are lead lanthanum zirconia titanate (Pb$_{1-y}$La$_y$Zr$_{1-x}$Ti$_x$O$_3$, where $0<x<1$ and $0<y<1$, hereinafter PLZT) for a ferroelectric, strontium titanate (SrTiO$_3$) for a dielectric, and LSCO for a conductive oxide. As will become apparent with the examples below, the cubic metal-oxide layer 16 can be incorporated into a number of different devices.

EXAMPLE 1

A structure of FIG. 1 was grown for which the anisotropic perovskite was bismuth titanate (Bi$_4$Ti$_3$O$_{12}$), and the cubic metal oxide was PLZT with $x=0.8$ and $y=0.1$. Bi$_4$Ti$_3$O$_{12}$ has an orthorhombic crystal structure with lattice parameters of 0.541, 0.545, and 3.28 nm. All depositions for this and other examples were performed by pulsed laser ablation following the procedures described in my other patents. The deposition of the YSZ layer upon the silicon substrate was performed in a separate system. This process has been described in the previously cited article by Fork et al. The targets for the depositions of the remaining different materials were all loaded into the deposition chamber and were rotated into the beam between depositions without opening the deposition system. The targets were sintered powder disks having the desired stoichiometry with the exception of oxygen. The YSZ layer, deposited to a thickness of 5 nm on a (001)-oriented silicon wafer, had 9 mole % yttria to stabilize the cubic phase. The template layer was 20 nm of Bi$_4$Ti$_3$O$_{12}$ deposited with a substrate holder temperature of 640° C. so that it formed with a c-axis orientation. The substrate holder temperature was held at 640° C. while 0.3 μm of PLZT were deposited to form the layer of cubic metal oxide. X-ray diffraction showed only the (00 m) peaks for the PLZT, indicative of its highly oriented growth as a perovskite. The width of the (001) peak at $2\theta=22°$ was less than 0.3°. Channeling yields of about 35% may be compared to yields of 17% for PLZT grown on crystalline LaAlO$_3$ substrates.

COMPARATIVE EXAMPLE 1

Another structure was grown that was same as that of the first example except that no template layer was grown. X-ray diffraction showed no (00 m) perovskite peaks but only the (111) pyrochlore peak. Thus, without the template layer, the PLZT did not form as a perovskite but formed instead as a non-ferroelectric pyrochlore.

A second embodiment of the invention is a ferroelectric random access memory (FRAM). An FRAM integrated circuit includes an array of memory cells, one of which is illustrated in cross section in FIG. 2. The fully stabilized YSZ layer 10 is deposited on the (001)-oriented silicon wafer 12 to a thickness preferably in the range of 50 to 100 nm. The thin template layer 20, composed of a layered perovskite material preferably 2 to 10 nm thick, is deposited on the YSZ layer 10 under conditions favoring c-axis oriented growth. Examples of such materials for the FRAM include YBCO, Bi$_2$Sr$_2$Ca$_{n-}$Cu$_{n+1}$O$_y$, where n is a non-negative integer, La$_{2-x}$Sr$_x$CuO$_4$, where $0>x>1$, and Bi$_4$Ti$_3$O$_{12}$. Other examples are those materials substitutionally derived from Bi$_4$Ti$_3$O$_{12}$, as has been disclosed by Subbarao in "Ferroelectricity in Bi$_4$Ti$_3$O$_{12}$ and Its Solid Solutions," *Physical Review*, volume 122, 1961, pp. 804–807.

Over the template layer 20 is deposited a lower electrode layer 22 composed of a cubic or nearly cubic conductive perovskite or other metal oxide. Examples of such material for the FRAM include LSCO, SrRuO$_3$, SrCrO$_3$, and SrVO$_3$. A thin ferroelectric layer 24, preferably PLZT, is deposited over the lower electrode 22. Other examples of ferroelectric materials are discussed in my patent application Ser. No. 07/616,166, now U.S. Pat. No. 5,168,420, issued Dec. 1, 1992. An upper electrode layer 26 is deposited over the ferroelectric layer 24 and preferably is composed of the same material as the lower electrode layer 22.

Two masking and etching steps produce a stepped structure which is isolated at the bottom electrode 22 and which allows contacting to the top surface of the bottom electrode 22. A spin-on glass forms an insulating layer 30 that isolates the electrodes 22 and 26 but defines contact holes for them. A metallization is deposited and defined to form the electrical interconnections 32 and 34 between the electrodes 22 and 24 and other circuitry, which may include a MOS gate formed in the silicon substrate 12 as a gating circuit for the FRAM.

EXAMPLE 2

Figure 2:
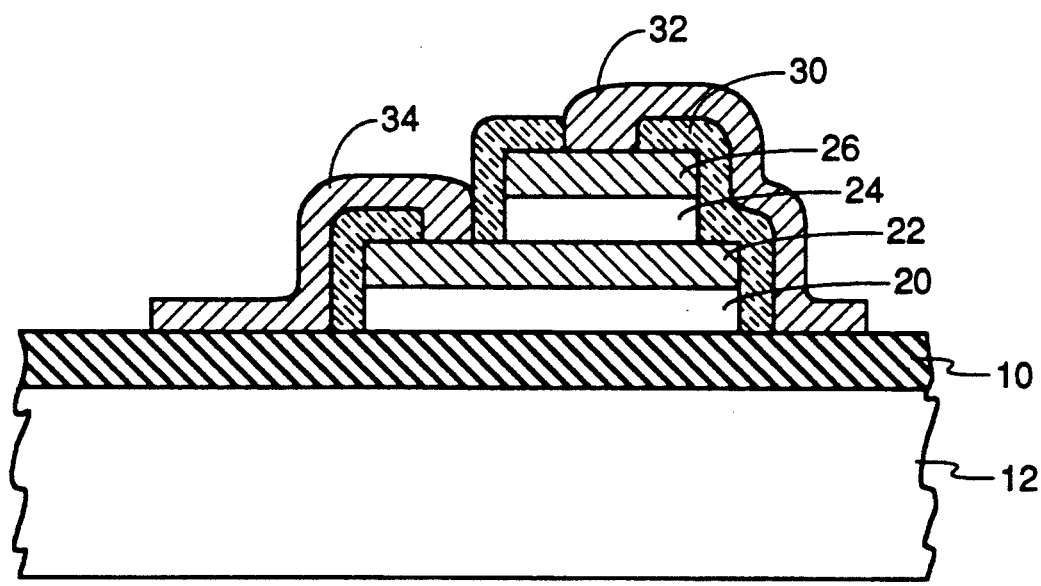
FIGS. 2 through 4 are cross-sectional views of additional embodiments of the invention.
Figure 3:
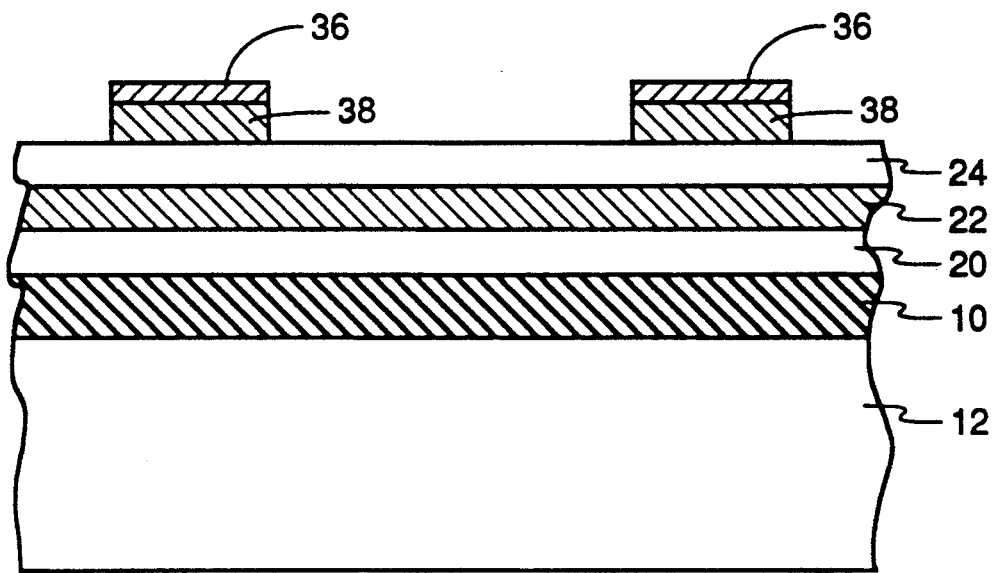

A ferroelectric memory was fabricated having the general structure of the memory of FIG. 2 but with minimal lateral definition. As illustrated in FIG. 3, a template layer 20 of YBCO was deposited on a YSZ-buffered substrate 10 and 12 to a thickness of 20 nm with the substrate holder held at 810° C. The temperature caused the YBCO to grow with a c-axis orientation. The substrate-holder temperature was reduced to 640° C., and a layer 20 of LSCO with $x=0.5$ was grown to a thickness of 100 nm to form the lower electrode 22. A ferroelectric layer 24 of PLZT of the same composition as the first example was grown at 640° C. to a thickness of 0.3 μm. An upper electrode layer of LSCO was grown similarly to the lower electrode layer 20. An advantage of LSCO over YBCO for the electrodes arises from the fact that the PLZT is not exposed to high temperature during the growth of the upper electrode layer.

Metallization of Pt/Au was deposited and photolithographically defined into an array of 100 μm circles 36. After removal of the photoresist, the upper LSCO layer was etched away with 1% nitric acid, thus isolating individual upper electrodes 38. Rather than performing another mask-and-etch step to contact the lower electrode 20, a very large upper electrode 38 was included in the mask pattern. In the electrical tests, electrical leads were connected between a selected small upper electrode and the very large upper electrode, and the polarization-determined capacitance of the serial circuit was dominated by the capacitor of the smaller selected electrode.

The memory element was electrically tested. With 2 V bipolar pulses, it showed remanent polarization of $\pm 13.5$ $\mu C/cm^2$. It was then tested for fatigue with the 2 V bipolar pulses applied at 5 MHz. After $2 \times 10^{12}$ cycles, the remanent polarization had decreased to about $\pm 11$ $\mu C/cm^2$ with only slight asymmetry. This long life sharply contrasts with the fatigue in polycrystalline FRAMs which has always been a problem.

The invention can be applied to integrated optics utilizing the electrooptic effect in which a voltage signal induces a phase shift in an optical signal by changing the refractive index of an electro-optic material, such as PLZT. The PLZT is a cubic perovskite which can be sandwiched by cubic metal oxide electrodes.

EXAMPLE 3

The electro-optic effect was demonstrated in a device, also illustrated in FIG. 3, grown with a $Bi_4Ti_3O_{12}$ template layer 20 of thickness 20 nm over the YSZ layer 10, a lower LSCO electrode layer 22 of thickness 100 nm, a PLZT layer 24 of 300 nm thickness, and a set of upper LSCO electrodes 38 of 80 nm thickness. The metal circular contacts 36 were formed of 10 nm of Ti. When red light irradiated the optically thin Ti circles which were being simultaneously electrically modulated at 100 Hz between $\pm 5$ V, the reflected light showed the refractive index to be modulated at the same frequency to the extent of $\Delta n = 2 \times 10^{-4}$ but to follow the "hysteresis" pattern predicted for the electro-optic effect in ferroelectrics.

Figure 4:
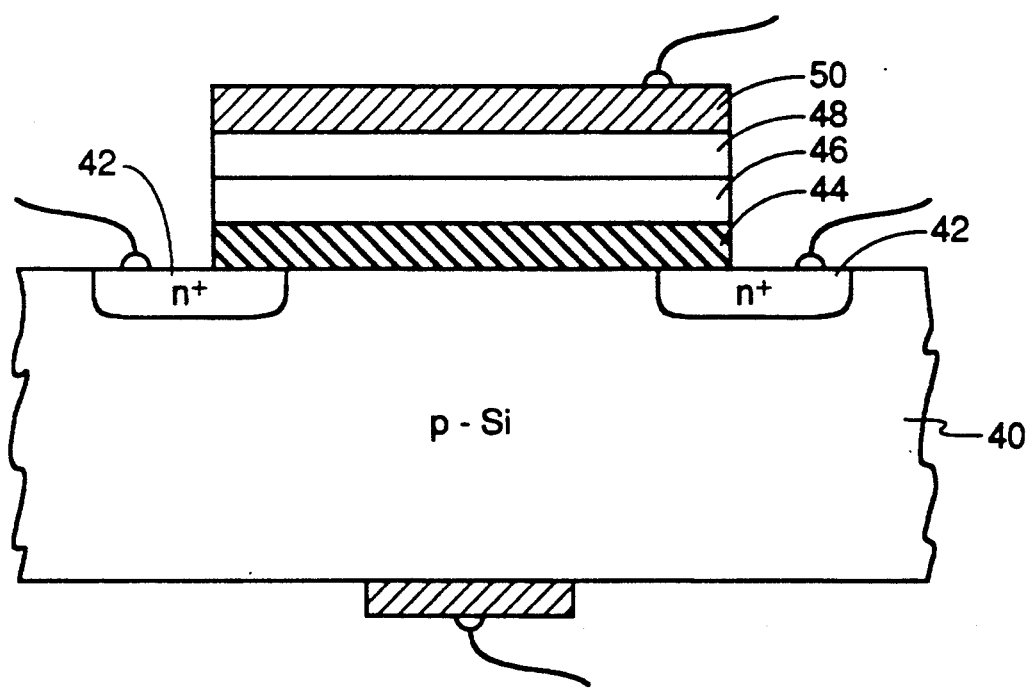

Another embodiment of the invention, illustrated in cross-section in FIG. 4, is a ferroelectric memory field-effect transistor (FEMFET). This transistor functions similarly to a standard field effect transistor except that, once it is turned on (or off) by an active gating signal, it remains in that state after the gating signal is removed. The state is reversed with a gating signal of opposite polarity. Polycrystalline FEMFETs have been disclosed by Lampe et al. in "Integration of UHV-grown ferroelectric films into nonvolatile memories," *Seventh International Symposium on the Applications of Ferroelectrics*, 1990, Paper 7.5.

In this FEMFET, a p-type (001)-oriented silicon substrate 40 has n+ wells 42 diffused or implanted into its surface for the source and drain. A thin, fully stabilized crystalline YSZ layer 44 is deposited on the substrate 40. Its thickness is minimized to preferably less than 10 nm so as to reduce the voltage needed to polarize the ferroelectric. A thin template layer 46 is epitaxially deposited on the YSZ layer. Its thickness is preferably between 2 and 10 nm. A good template material is $Bi_4Ti_3O_{12}$ because most ferroelectric materials are closely lattice matched to it in the a-b plane. A single crystalline ferroelectric layer 48 of, for example, PLZT or $BaTiO_3$ is deposited on the template layer 46 to a thickness of the order of 300 nm. A metal electrode 50 is deposited over the ferroelectric layer 46. Photolithography defines the gate layers to the surface of the silicon so that the gate barely overlaps the source and drain wells 42. Electrical leads are applied to the gate layer 48, the source and drain wells 42, and to the back of the substrate 40 (or to a layer beneath a p-type epilayer 40). This FEMFET operates in the normally off enhancement mode, but the invention is equally applicable to a normally on depletion-mode FEMFET in which a channel beneath the YSZ layer 44 is doped of the same type as but to a lower density than the source and drains wells 42 and of the opposite type from the substrate 40.

The invention can be applied to many types of devices, such as those listed in the TABLE. Swartz has provided a review article for many of these types of applications in "Topics in Electronic Ceramics," *IEEE Transactions on Electrical Insulation*, volume 25, 1990, pp. 935-987. The TABLE also lists preferred materials for the layered perovskite and the cubic metal oxide, all of which here are nominally cubic perovskites. The TABLE often does not list the electrode material which may need to be inserted between the active cubic perovskite and the template. This electrode material is fairly freely chosen and may be either a layered or cubic perovskite or other metal oxide as long as it is compatible with the other material. In all cases of $Bi_4Ti_3O_{12}$, layered structures substitutionally derived from it may be used.

TABLE

| Application | Layered Perovskite Template | Cubic Perovskite |
|---|---|---|
| FEMFET | $Bi_4Ti_3O_{12}$ | PLZT |
| | | $BaTiO_3$ |
| Electrodes for FRAM | YBCO | $La_{1-x}Sr_xCoO_3$ |
| | $Bi_2Ca_nCu_{n+1}O_y$ | $SrRuO_3$ |
| | $La_{2-x}Sr_xCuO_4$ | $SrCrO_3$ |
| Capacitors | $Bi_4Ti_3O_{12}$ | $SrVO_3$ |
| Dielectrics for DRAMs | $Bi_4Ti_3O_{12}$ | $SrTiO_3$ |
| | | $Ba_{1-x}Sr_xTiO_3$ |
| SAW Devices, filters and delay lines | $Bi_4Ti_3O_{12}$ $PbTiO_3$ | PLZT |
| Integrated Pyroelectric Detectors | $Bi_4Ti_3O_{12}$ | $PbTiO_3$ PLT PLZT |
| Integrated Optics | $Bi_4Ti_3O_{12}$ | PLZT |
| Non-destructive Read-out Memories | $Bi_4Ti_3O_{12}$ | PLZT |
| Smart Materials | YBCO | PLZT $BaTiO_3$ |
| Integrated Piezoelectric Transducers | $Bi_4Ti_3O_{12}$ | PLZT $BaTiO_3$ |

Dynamic random-access memories (DRAMs) are the most widely manufactured semiconductor memory. Their storage element is a capacitor that is charged to one of two states. Instead of the non-volatile capacitor of the FRAM, a DRAM would use a non-hysteretic dielectric material such as $Ba_{1-x}Sr_xTiO_3$ or $SrTiO_3$ to fill the gap of the capacitor with the capability for large charge storage. The electrodes sandwiching the capacitor's dielectric would be formed of a metal oxide such as LSCO.

Surface acoustic waves (SAW), exploited in forming various devices including filters and delay lines, rely upon piezoelectric materials, such as $LiNbO_3$, which is hexagonal, quartz, and PLZT. Sreenivas et al. has discussed SAW devices using piezoelectric thin films in "Surface acoustic wave propagation on lead zirconate titanate thin films," *Applied Physics Letters*, volume 52, 1988, pp. 709–711. In such thin-film SAW devices, the surface acoustic wave is launched into the thin film by interdigitated transducers and is waveguided within the thin film.

Integrated optics utilizing the electro-optic effect were briefly described before. Ferroelectric materials such as PLZT have very large electro-optic effects. One application of integrated optics using ferroelectric thin films includes optical waveguides and related devices such as phase shifters and Mach-Zehnder modulators, as have been described by Kawaguchi et al. in "PLZT thin-film waveguides," *Applied Optics*, volume 23, 1984, pp. 2187–2191 and Mukherjee et al. in "Electro-optic effects in thin-film lanthanum-doped lead zirconate titanate," *Optics Letters*, volume 15, 1990, pp. 151–153. For waveguiding, the main material requirement is that the guiding medium must have a refractive index larger than that of the surrounding regions. In the case of thin films, the perovskite thin film must be of higher refractive index than the substrate. In the case of a substrate of YSZ-buffered silicon, the refractive index of YSZ is approximately 1.75 while that of the perovskites is in the range of 2.35 to 2.7. Hence a single optical mode can propagate in a 0.2 $\mu$m-thick film.

Another electro-optic application is for spatial light modulators in both the visible and in the 1.3–1.55 $\mu$m regimes. This type of device has been disclosed by Lee et al. in "Two-dimensional silicon/PLZT spatial light modulators: design considerations and technology," *Optical Engineering*, volume 25, 1986, pp. 250–260. However, the current devices are fabricated by laser recrystallization of the silicon deposited on polycrystalline PLZT. The polycrystallinity of both materials is detrimental. These modulators are used in programmable Fourier plane filtering, optical logic, scratch-pad memory, and series-to-parallel conversion among others. A spatial light modulator of the invention has a silicon substrate including photodetectors and drivers and a crystalline PLZT thin film and associated buffer layers grown over it for the modulators.

Yet further applications include acousto-optic light deflectors and integration of the electro-optic ferroelectric thin films with semiconductor lasers.

Two types of non-destructively read-out memories rely on ferroelectric layers. One is the FEMFET that was previously described. The second is disclosed by Evans et al. in U.S. Pat. No. 5,051,950 and by Thakoor in "High speed, nondestructive readout from thin-film ferroelectric memory," *Applied Physics Letters*, volume 60, 1992, pp. 3319–3321. In this second memory, electrical pulses write one of two logic states into a ferroelectric capacitor. However, the stored information is read out using the electro-optic effect, that is, by using a laser beam. Since the polarization state differs according to what was electrically recorded, the interaction between the laser beam and the material correspondingly differs. At least a 0.2° phase angle difference between the two logic states is required if they are to be uniquely detected.

In a pyroelectric material, the polarization varies in response to a change in temperature, an effect quantified by the pyroelectric coefficient $\gamma$. Pyroelectric detectors can be used as radiation detectors of heat or infrared, including imaging. Ferroelectric perovskites such as $PbTiO_3$, PLZT, and lead lanthanum titanate show good pyroelectric qualities. Takayama et al. has disclosed pyroelectric thin-film detectors in "Preparation and characteristic of pyroelectric infrared sensors made of c-axis oriented La-modified $PbTiO_3$ thin films," *Journal of Applied Physics*, volume 61, 1987, pp. 411–415. Thin-film pyroelectrics provide the capability of being integrated into imagers and combined with silicon peripheral circuitry. If the pyroelectric ferroelectrics are produced with significant crystallographic orientation by epitaxial growth, significantly larger pyroelectric signals can be obtained without the need for poling. Furthermore, highly absorbing electrodes such as YBCO or LSCO provide a black-body structure.

Smart materials, including integrated actuators and sensors, are those that learn from their experience. Newnham et al. provide a review article in "Smart Electroceramics," *Journal of the American Ceramics Society*, volume 74, 1991, pp. 463–479. In simple terms, these materials or devices use some type of a feedback circuit to continuously alter their state in response to a continuously varying external stimulus. Hence, these smart materials are a special type of sensor which respond to external stimuli, which can be electrical, chemical, mechanical, optical, magnetic, or thermal. To date, these sensors are integrated with the control network using hybrid multi-chip modules. The use of oxide electrodes which are lattice and chemically matched to the perovskite smart materials, e.g., PLZT, provides significant advantages in integrating the smart material, resistors, capacitors, and interconnects on a single chip.

Although most of the examples have used the template layer solely as a second buffer layer for a device grown over it, its properties may allow its incorporation into the device. One example is the non-volatile memory described in the parent patent which has a YBCO/PZT/YBCO capacitor deposited directly on the yttria-buffered silicon. Although in the examples the YSZ layer has been epitaxial with the silicon, it is known that YSZ provides a template for crystalline growth even if it is grown on a non-crystalline substrate. The invention allows the use of other template materials, such as sapphire and $CeO_2$, to facilitate c-axis growth of the anisotropic perovskite. Although in the examples, pulsed laser ablation formed the structures, other deposition methods may be used, for example, the various forms of chemical vapor deposition and molecular beam epitaxy.

The template of the invention allows a wide class of technologically important oxides to be grown on silicon in a preferred crystalline state. The breadth of its applicability allows a wider choice of intermediate layers, e.g. the substitution of LSCO for YBCO, which may offer advantages such as lower processing temperatures and more benign interfaces. The invention also provides for the possibility of an epitaxial heterostructure involving two materials of significantly different lattice constants.

What is claimed is:

1. A silicon/metal-oxide heterostructure, comprising:
   a silicon substrate;
   a buffer layer formed on said silicon substrate;
   a template layer comprising an anisotropic perovskite formed on said buffer layer, said buffer layer allowing said template layer to be formed substantially c-axis oriented; and a nominally cubic metal-oxide layer formed on said template layer.

2. A heterostructure as recited in claim 1, wherein said buffer layer comprises yttria-stabilized zirconia.

3. A heterostructure as recited in claim 1, wherein said metal-oxide layer is conductive and substantially singly crystalline and forms a lower electrode and further comprising:

a substantially singly crystalline ferroelectric layer formed on said metal-oxide layer; and a second conductive metal-oxide layer formed on said ferroelectric layer.

4. A heterostructure as recited in claim 3, wherein said second metal-oxide layer is substantially singly crystalline and said two metal-oxide layers comprise a same metal oxide.

5. A heterostructure as recited in claim 4, wherein said same metal oxide comprises lanthanum strontium cobalate.

6. A heterostructure as recited in claim 4, wherein said same metal oxide comprises $SrRuO_3$.

7. A heterostructure as recited in claim 1, wherein said cubic metal-oxide layer comprises a ferroelectric layer.

8. A heterostructure as recited in claim 7, wherein said silicon substrate comprises a region of a first conductivity beneath a middle portion of said metal-oxide layer and regions of a second conductivity beneath end portions of said metal-oxide layer.

9. A heterostructure as recited in claim 1, wherein said cubic metal-oxide layer comprises a piezoelectric layer.

10. A heterostructure as recited in claim 1, wherein said cubic metal-oxide layer comprises an electro-optic layer.

11. A heterostructure as recited in claim 1, wherein said cubic metal-oxide layer comprises a pyroelectric layer.

12. A heterostructure as recited in claim 1, wherein said template layer comprises bismuth titanate.

13. A ferroelectric memory element, comprising:

a singly crystalline silicon substrate;

a buffer layer formed on said substrate;

a singly crystalline film comprising a conductive metal oxide formed on said buffer layer, said buffer layer promoting said metal oxide to form as said singly crystalline film; and a ferroelectric layer epitaxially formed on said crystalline film.

14. A ferroelectric memory element as recited in claim 13, wherein at least 80% of said ferroelectric layer has a c-axis orientation.

15. A method of forming a silicon/metal-oxide heterostructure, comprising the steps of:

depositing upon a crystalline silicon substrate a first layer of a buffer material;

depositing upon said first layer a second layer comprising an anisotropic perovskite under growth conditions favoring c-axis oriented growth of said anisotropic perovskite, said buffer material facilitating growth of said second layer as a substantially crystalline layer; and depositing upon said second layer a third layer comprising a nominally cubic metal oxide.

16. A method as recited in claim 15, wherein said buffer material is yttria-stabilized zirconia.

17. A method as recited in claim 15, wherein said growth conditions include holding said first layer at a first temperature and further comprising depositing upon said second layer a substantially crystalline fourth layer comprising a ferroelectric while said first, second, and third layers are held at a second temperature lower than said first temperature.

* * * * *